US 6,734,702 B1

(12) United States Patent
Ikeoku et al.

(10) Patent No.: US 6,734,702 B1
(45) Date of Patent: May 11, 2004

(54) IMPEDANCE CALIBRATION CIRCUIT

(75) Inventors: Takayuki Ikeoku, Ibaraki (JP); Ryu Hasunuma, Ibaraki (JP); Kenji Namba, Tokyo (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/292,342

(22) Filed: Nov. 12, 2002

(51) Int. Cl.[7] ............................................... H03K 17/16
(52) U.S. Cl. .............................. 326/30; 326/86; 326/90; 327/108; 327/112; 330/9
(58) Field of Search .............................. 326/30, 86, 83, 326/90; 327/108, 112, 170; 710/100, 126; 330/9, 307, 525

(56) References Cited

U.S. PATENT DOCUMENTS

| 5,510,727 | A | | 4/1996 | Culmer et al. |
|---|---|---|---|---|
| 5,973,490 | A | | 10/1999 | Nauta |
| 6,064,224 | A | | 5/2000 | Esch, Jr. et al. |
| 6,307,424 | B1 | | 10/2001 | Lee |
| 6,331,786 | B1 | | 12/2001 | Whitworth et al. |
| 6,417,675 | B1 | * | 7/2002 | Johnson ........................ 324/601 |
| 6,448,815 | B1 | * | 9/2002 | Talbot et al. ................... 326/86 |
| 6,507,241 | B1 | * | 1/2003 | Ritter .............................. 330/9 |
| 6,624,670 | B2 | * | 9/2003 | Payne et al. ................. 327/108 |

* cited by examiner

Primary Examiner—Vibol Tan
(74) Attorney, Agent, or Firm—William B. Kempler; W. James Brady, III; Frederick J. Telecky, Jr.

(57) ABSTRACT

An impedance calibration circuit for a serial ATA (SATA) transmitter has a resistor in series with each leg of the differential output of the transmitter. An array of selectable resistors is in parallel with each of the series resistors. Resistors in the array are selected to be in parallel with the series resistors. A calibration circuit utilizes a comparator to determine when the minimum error in the impedance calibration is reached. Offset errors in the comparator are compensated for by a circuit which determines the center of alternate ones and zeros generated by the comparator when the input signals are within the offset of the comparator, which should be the point of minimum error in the calibration.

27 Claims, 6 Drawing Sheets

IMPEDANCE CALIBRATION CIRCUIT

FIELD OF THE INVENTION

The present invention impedance calibration circuit and more specifically to an impedance calibration circuit for a serial ATA (SATA) transmitter.

BACKGROUND OF THE INVENTION

Current computers use parallel ATA hard drives and other peripherals which are connected to the controller by a 40 or 80 wire ribbon cable. This parallel bus interface is reaching its performance limits at data rates of 133 MB/sec. This interface will be replaced by a serial ATA interface which, in addition to having higher data rates, will utilize low voltage signaling. The SATA interface replaces the 80 conductor ribbon cable with a 4 conductor cable. Problems associated with the ribbon cable in blocking air flow within the computer box and folding the cable during assembly are thus eliminated. The data is sent out in a serialized form as a differential signal pair having a 250 mV signal swing which is much less than the 3 or 5 volt signal swing used in parallel ATA interfaces.

The SATA interface will initially have a data rate of 150 MB/sec which requires a speed of 1.5 Gbps for serial data transmission. The second and third generation data rates will be 300 MB/sec and 600 MB/sec, necessitating transmission speeds of 3.0 Gbps and 6.0 Gbps, respectively.

The impedance of the cable that connects the peripheral to the controller can vary with the type of cable used. Furthermore, the input impedance of the receiver circuit in the peripheral may vary among the manufactures of the peripherals. Signal reflection noise becomes a significant problem at the data transmission speeds that are utilized in SATA devices and will become more severe in the next 2 generations of the standard. At lower frequencies the reflection decays within one clock cycle. At the frequencies utilized in SATA, the system does not have enough time to await the decay of the signal reflection noise. Thus the matching of the transmitter and receiver impedance is more critical. The signal reflection noise problem is further exacerbated by the much lower amplitude of the transmitted signal when compared to parallel ATA transmissions.

It is known from U.S. Pat. No. 6,064,244 to use an up/down counter in an impedance matching circuit. In the patent, the impedance matching is for the p-channel pull-up transistors and the n-channel pull-down transistors of a CMOS digital output driver.

SUMMARY OF THE INVENTION

A general object of the invention is to provide a technique for calibrating a SATA transmitter.

This and other objects and features of the invention are attained by a transmitter for a serial ATA (SATA) interface comprising a transmitter circuit having a differential output and an impedance matching circuit. The impedance matching circuit has a pair of resistors, one of the resistors being in series with each of the differential outputs of the transmitter circuit. A pair of resistor arrays, one of the arrays being in parallel with each of the series resistors, each of the arrays having a plurality of selectable resistors. A calibration circuit coupled to the selectable resistors for selecting resistors in each of the arrays which will be coupled in parallel to the respective series resistor.

Another aspect of the invention includes a serial ATA (SATA) system comprising a transmitter circuit having a differential output, each leg of the differential output having a series resistor. First and second resistor arrays are coupled in parallel to a respective one of the series resistors. A transmission line is coupled to an output node of each of the resistor arrays, the transmission lines each having a characteristic impedance. A host receiver having an input impedance is coupled across each of the transmission lines. A calibration circuit is coupled to the selectable resistors for selecting resistors in each of the resistor arrays which will be coupled in parallel to the respective series resistor whereby the output impedance is calibrated to the AC impedance of the transmission lines and the DC input impedance of the host receiver.

A further aspect of the invention is provided by a method of calibrating output impedance of a serial ATA (SATA) transmitter. A resistor is provided in each leg of a differential output of a transmitter, each resistor being coupled to a transmission line having a characteristic impedance. A resistor array is provided in parallel with each of the resistors, each array having a plurality of selectable resistors. One or more resistors is selected from each of the arrays to calibrate the output impedance of the transmitter to match the characteristic impedance of each transmission line with minimum error.

A still further aspect of the invention comprises an offset correction circuit for a comparator. A first multiplexer couples a first input to a comparator between a first signal source and a first reference source. A second multiplexer couples a second input to the comparator between a second signal source and a second reference source. A logic circuit is coupled to an output of the comparator for detecting when a logical output thereof changes from all logical ones to a combination of logical ones and logical zeros and for determining a central point in the combination of logical ones and logical zeros as a point of minimum error.

Yet another aspect of the invention is provided by a method of correcting for offset in a comparator. A first input to the comparator is coupled between a first signal source and a first reference source. A second input to the comparator is coupled between a second signal source and a second reference source. A logical output of the comparator changing from all logical ones to a combination of logical ones and logical zeros; is detected. A central point in the combination of logical ones and logical zeros is determined to be a point of minimum error.

DETAILED DESCRIPTION OF THE PRESENT INVENTION

Figure 1:
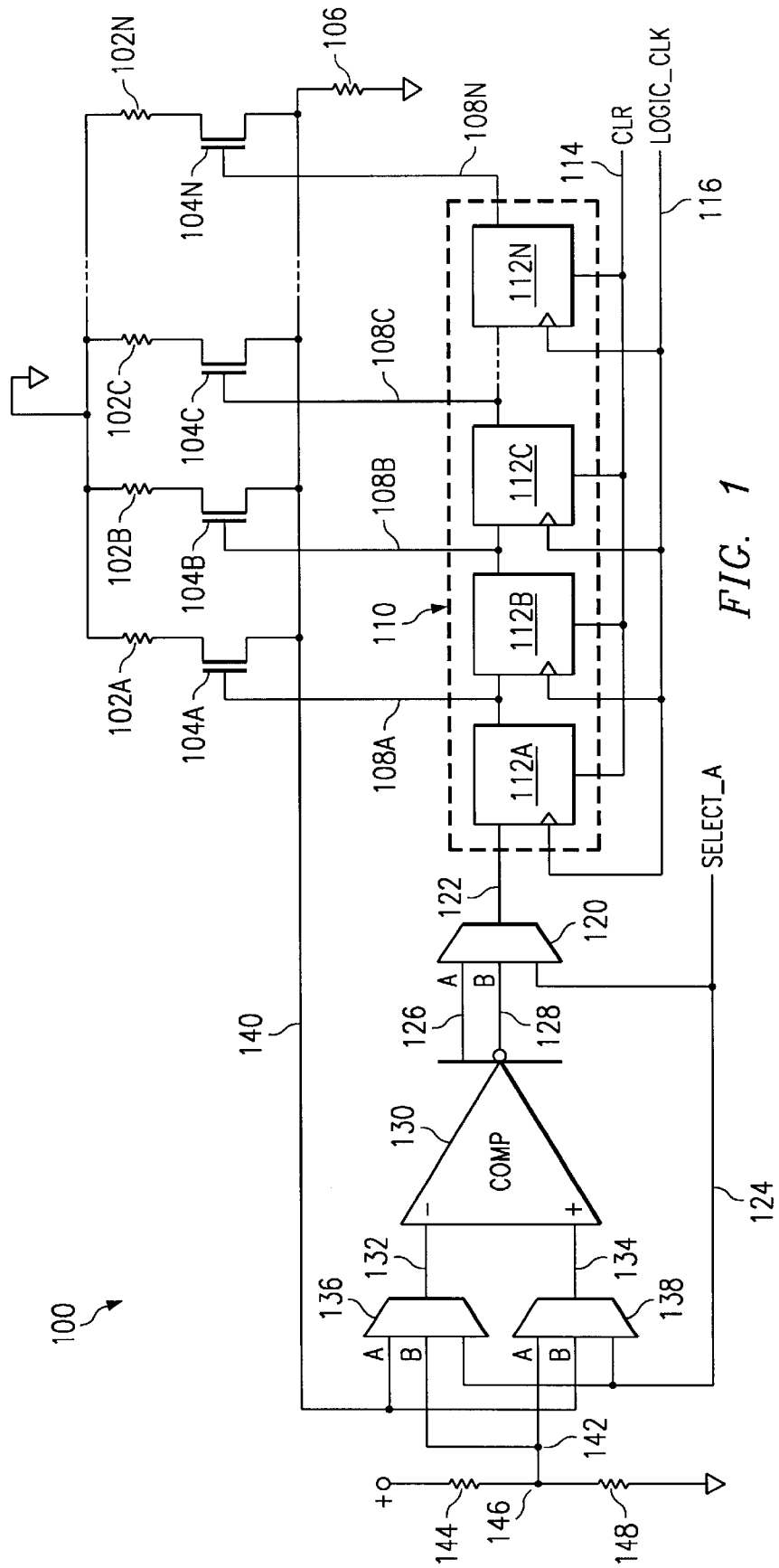
FIG. 1 is a schematic diagram showing the concept of the present invention.

The circuit shown in FIG. 1 implements the impedance calibration technique of the present invention. The impedance calibration is provided by a plurality of parallel connected resistors 102A, 102B, 102C . . . 102N where N is an integer. Each of the resistors is selected by a corresponding transistor 104A, 104B, 104C . . . 104N. The common ends of the resistor are connected to a voltage supply and the selected ends of the resistor are connected to resistor 106, the other lead of which is connected to ground. Each transistor 104A, 104B, 104C . . . 104N acts as a switch controlled by the signal on lines 108A, 108B, 108C . . . 108N, respectively. These signals are the outputs of a shift register 110. Other register means having similar characteristics may also be used. The more transistors 104 that are turned on, the lower the impedance of the array becomes.

Shift register 110 is composed of flip-flops 112A, 112B, 112C . . . 112N having a serial input 122 connected to flip-flop 112A. The output of each flip-flop is connected to input of the next flip-flop in the shift register and each output is used as an output of the shift register. Thus, the output of flip-flop 112A is connected to line 108A, the output of flip-flop 112B is connected to line 108B, the output of flip-flop 112C is connected to line 108C and the output of flip-flop 112N is connected to line 108N. Flip-flops have a common clock line 116 connected to a signal LOGIC_CLK and there is also a common reset line 114 connected to a signal CLR. The node at the junction of the parallel resistors 102 and the resistor 106 is connected by line 140 to input of the comparator 130 via the "A" input of multiplexer 136 and the "B" input of multiplexer and 138. The "B" input of multiplexer 136 and the "A" input of multiplexer 138 are connected to the node 146 between resistor 144 and 148. The distal end of resistor 144 is connected to a positive supply and the distal end of resistor 148 is connected to ground. The output of the multiplexers 136,138 on lines 132 and 134, respectively, are selected by the signal SELECT_A on line 124. The output of multiplexer 136 on line 132 is fed to the inverting input of comparator 130 and the output of the multiplexer 138 on line 134 is fed to the noninverting input of the comparator 130. The comparator has differential outputs 126,128 which in turn are the "A" and "B" inputs to multiplexer 120, respectively. The input to multiplexer 120 which is selected as the output on line 122 is also controlled by the signal SELECT_A on line 124.

If we assume that the signal SELECT_A is applied to the multiplexers 126, 136, 138 to select the "A" input, the voltage of node 146 is applied to the noninverting input of comparator 130 and the voltage on line 140 is applied to the inverting input of the comparator 130. Comparator 130 then compares the two voltages to generate a logical output which is fed through a multiplexer 120 to the serial input 122 of shift register 110. When the voltage on line 140 is higher than that on node 146, which occurs when the ratio of the impedance of the array of resistors 102 to the resistor 106 is smaller than the ratio of the impedance of resistor 144 to 148, the shift register 110 receives a logical zero at each clock pulse LOGIC_CLK on line 116. This will turn OFF more of the transistors 104 to increase the impedance of the array. Conversely, when the voltage on line 140 is lower than that of node 146, the shift register will receive a series of logical ones which will act to turn ON more transistors 104, which in turn will reduce the impedance of the array. The circuit will stabilize within N cycles of the signal LOGIC_CLK, completing the impedance calibration.

The time required for the circuit to complete the impedance calibration can be reduced if the shift register 110 is initially reset by the signal CLR on line 114. If the shift register 110 is reset initially and all of the output lines 108 carry logical zeros, then one can expect that as the circuit operation proceeds, shift register 110 receives a consecutive series of logical ones followed by a logical zero. By monitoring the signal on some of the outputs with a logic circuit, one can detect the completion of the impedance calibration before the circuit operates for N clock cycles. If the shift register is not reset initially and this output therefore carries zeros and ones randomly, then the shift register receives a complex pattern of ones and zeros and one has to wait until N clock cycles are completed in order to secure the completion of the impedance calibration.

Figure 5:
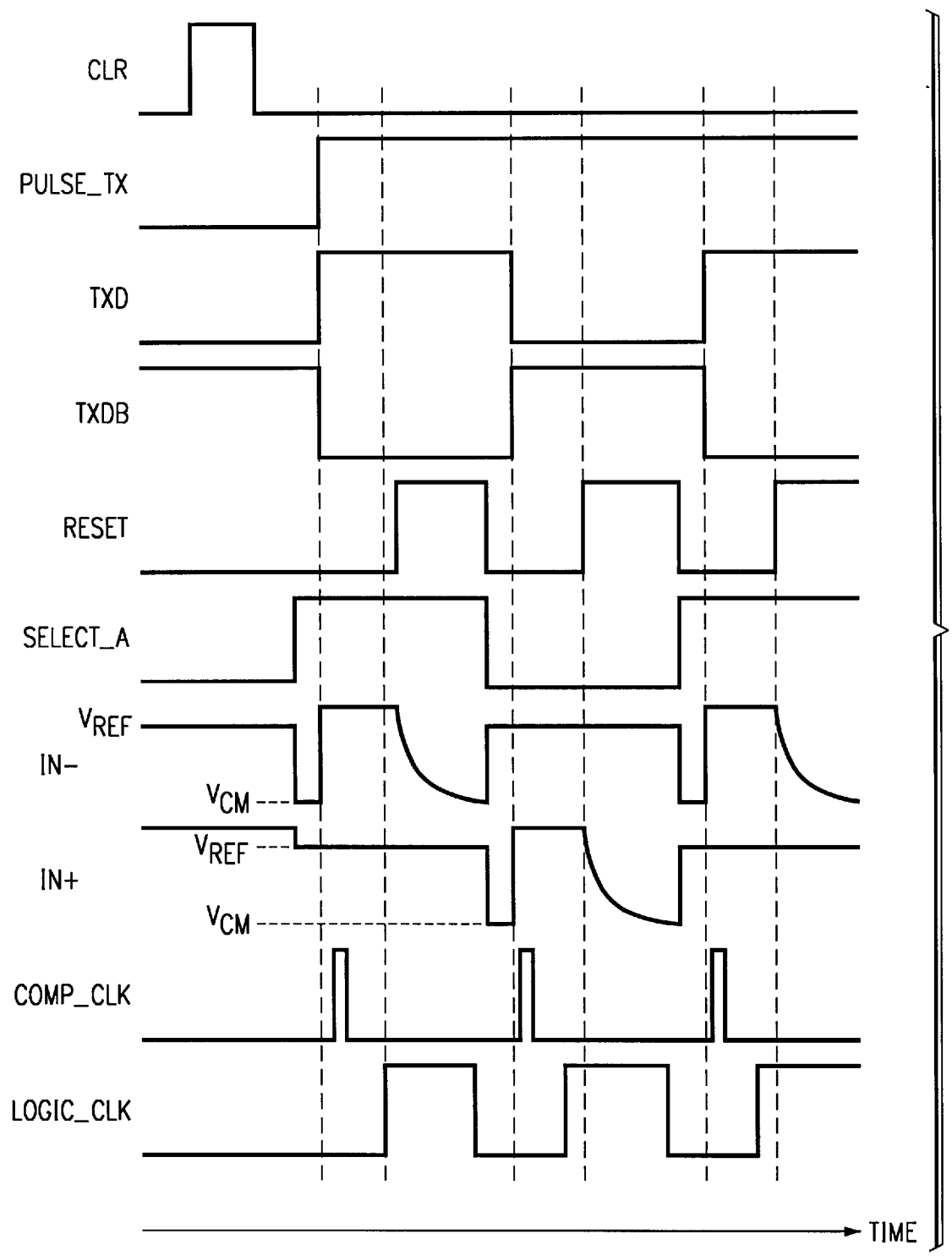
FIG. 5 shows the signals for the circuits of FIGS. 2 and 4.

Another problem is that the comparator 120 typically has a finite input offset voltage and therefore misjudges the input comparison when the absolute difference in voltage between its inputs is smaller than the input offset voltage of the comparator. This misjudgment causes a finite error in the impedance calibration. In order to reduce the error, the shift register 110 is initially reset and multiplexers 126, 136, 138 are employed to detect when the comparator 130 is making misjudgments. The signal SELECT_A is shown in FIG. 5. This signal is used to operate the multiplexers so that the voltage on line 140 and the voltage at node 146 are ultimately applied to each of the inverting and noninverting input terminals of the comparator 130 and each of the noninverting and inverting outputs of the comparator 130 ultimately selected as the outputs by multiplexer 120. When the voltage on line 140 is higher than the voltage at node 146 and the absolute difference is larger than the input offset voltage of the comparator 130, the output value of the multiplexer 120 is always a logical zero, regardless of whether the A or B inputs are selected. Similarly, when the voltage at node 146 is lower than the voltage on line 140, the absolute difference is larger than the input offset voltage of comparator 130, the output value of the multiplexer 120 is always a logical one, regardless of whether the A or B input terminals of the multiplexers 126, 136, 138 are selected. However, when the absolute voltage difference between the voltage on line 140 and node 146 is smaller than the input offset voltage of a comparator, the comparator 130 makes misjudgments in the comparison of its input voltage and the multiplexer outputs a series of alternate logical zeros and logical ones as the clock pulse SELECT_A on line 124 proceeds. Therefore, if the shift register 110 is initially reset and the clock pulses SELECT_A and LOGIC_CLK are provided, the shift register 110 receives a series of logical values 1, 1, 1, . . . , 1, 0, 1, 0, . . . 1, 0, 0, . . . , 0. By monitoring some of the outputs of the shift register 110 with a logic circuit, one can measure the range of the alternate logical zeros and logical ones or the duration of the misjudgment by the comparator 130 with its input voltage being within its input offset voltage range. Consequently, one can determine the central point in the range of the alternate logical zeros and ones as the likely operating point to provide the minimum error in the impedance calibration.

Figure 2:
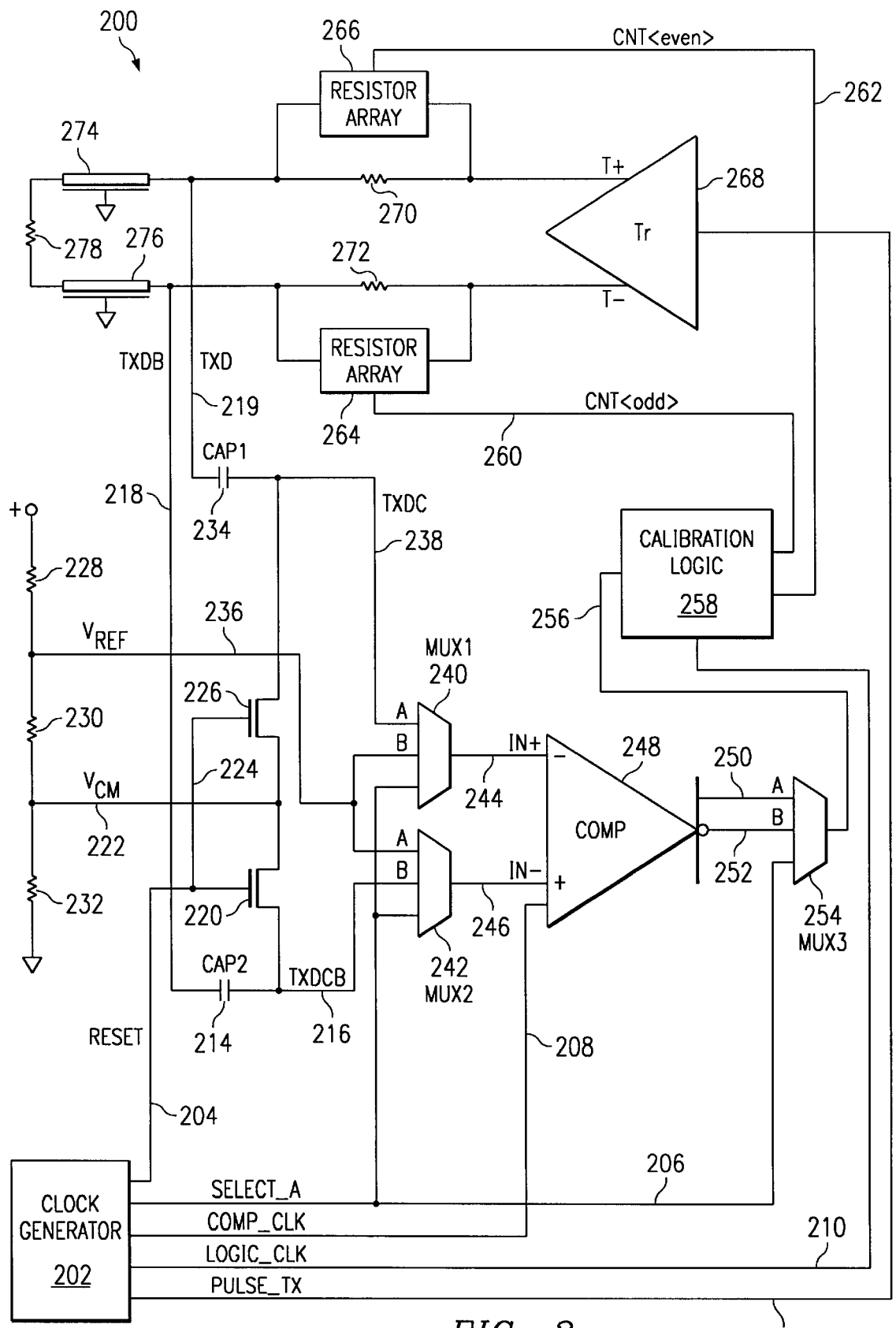
FIG. 2 is a schematic diagram of a SATA transmitter utilizing the present invention.

FIG. 2 shows the concept of FIG. 1 applied to a SATA transmitter generally shown as 200. A transmitter 268 has a differential output T+ and T− each of which are connected to transmission lines 274, 276 via resistors 270 and 272, respectively. The input impedance of a host receiver is shown schematically as resistor 278 which is coupled across the two transmission lines. The specifications for SATA transmission call for a 250 mV swing in the transmitted signal. As is known to those skilled in the art, if the output of the transmitter is a 500 mV swing and the transmitter impedance represented by the resistors 270 and 272 are perfectly matched with the transmission line impedance, voltage swing across the transmissions lines will be 250 mV. In order to match the output impedance the transmission line, resistor 270 has a resistor array 266 in parallel thereto and resistor 272 has a resistor array 264 in parallel thereto. The resistor array comprises a plurality of resistors in parallel, each of which can be selected to alter the impedance of the array.

Figure 3A:
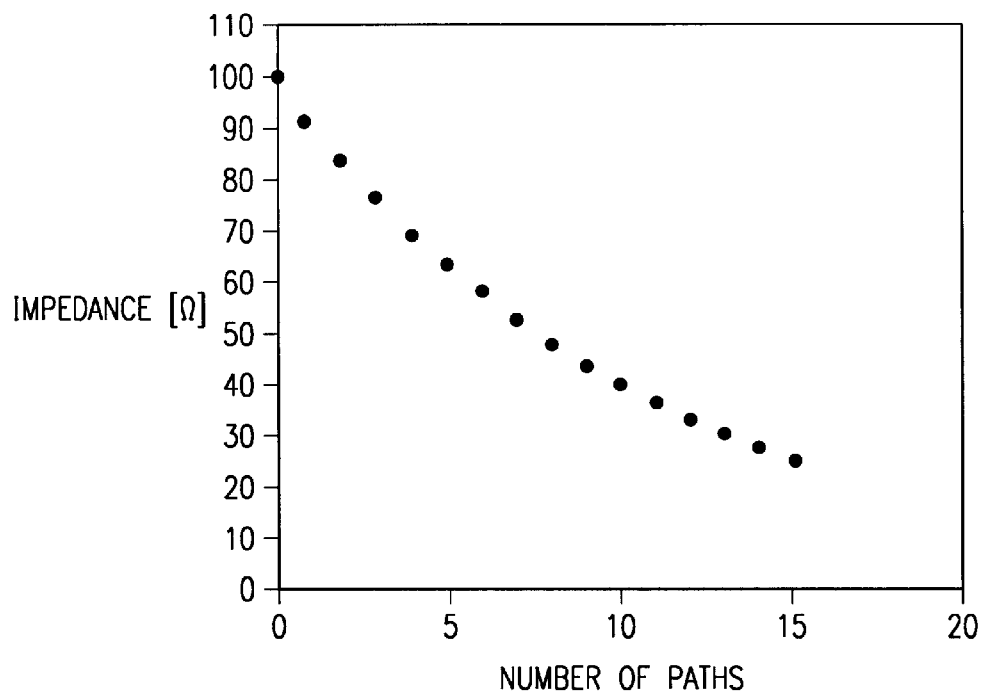
FIG. 3A is a graph showing the resistance value of one of the resistor arrays 264, 266 of FIG. 2 when drawn in a linear scale
Figure 3B:
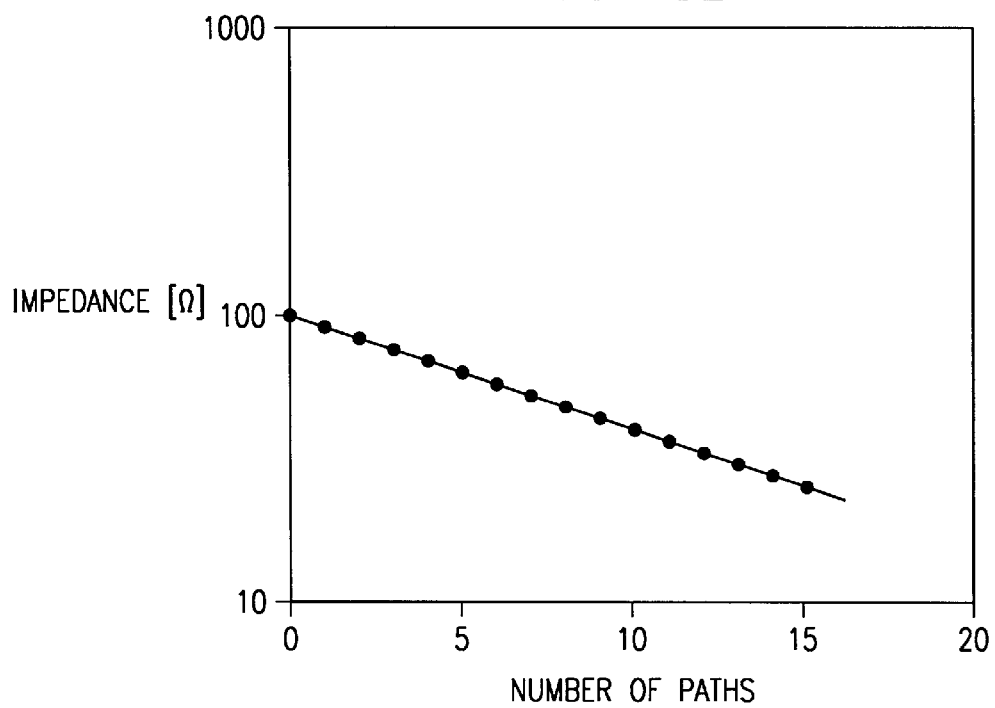
FIG. 3B shows the same resistor values plotted on a logarithmic scale.

FIG. 3A shows the impedance of the array in parallel with the resistor which is a result of a number of paths to individual resistors that are activated. In FIG. 3A, the impedance is plotted on a linear scale. FIG. 3B is identical to FIG. 3A except that the impedance of the array is plotted on a log scale. As can be seen from FIG. 3B, the values of the resistors in the arrays are chosen so that the impedance varies logarithmically from 100 to 25 ohms. The maximum error in the impedance calibration is the impedance value difference from each point in FIG. 3. Therefore, although the error varies with the target impedance when we vary the impedance in a logarithmic manner, the ratio of the error to the target would be constant. This is important because the coefficient of signal reflection is determined by the ratio, not the impedance value itself.

Returning to FIG. 2, the resistors in the array are selected by the calibration logic circuit 258 via lines 260 and 262. The circuitry of the calibration logic 258 is explained in greater detail in connection with FIG. 4.

The differential outputs of transmitter 268 are coupled by lines 218 and 219 to a comparator circuit. The signal line 218 is a capacitvely coupled to the comparator circuit via capacitor 214 and the signal on line 219 is capacitively coupled to the comparator circuit via capacitor 234. The second terminal of capacitor 214 is coupled via line 216 to the "B" input of multiplexer 242. The second terminal of capacitor 234 is coupled via line 238 to the "A" input of multiplexer 240. The second terminal of capacitor 234 is also coupled to the source of transistor 226, the drain of which is connected to the source of transistor 220. The drain of transistor of 220 is connected to the second terminal of capacitor 214. The gates of transistors 220 and 226 are connected by line 224 and connected to the RESET signal generated by clock generator 202 via line 204. The RESET signal and the other signals used in the operation of the circuit of FIG. 2 are shown in FIG. 5.

Resistors 228, 230 and 232 are coupled between a positive voltage source and ground. The node between resistors 228 and 230 is coupled to the other inputs of the first and second multiplexers; that is, the "B" input to multiplexer 240 and the "A" input to multiplexer 242. The node between resistors 230 and 232 is coupled via line 222 to the drain of transistor 226 and source of transistor 220. The output of multiplexer 240 is the signal IN+ on line 244 which is input to the inverting input of comparator 248. The output of multiplexer 242 is the signal IN– on line 246 which is input to the noninverting input of comparator 248. Comparator 248 has a differential output on lines 250 and 252, both of which are input to multiplexer 254. The noninverting output of comparator 248 on line 250 is coupled to the "A" input of multiplexer 254 while the inverting output of comparator 248 on line 252 is coupled to the "B" input to multiplexer 254. The output of multiplexer 254 on line 256 is input to the calibration logic circuit 258.

The multiplexers 240, 242, 254 are each connected to the signal SELECT_A on line 206. The comparator 248 is also coupled to the signal COMP_CLK on line 208. The calibration logic circuit 258 is also coupled to the signal LOGIC_CLK on line 210 and the transmitter is coupled to the signal PULSE_TX on line 212.

In a SATA transmitter, the impedance at the output of each leg of the transmitter varies in a logarithmic manner from 100 to 25 ohms with an increase in the number of paths connected in parallel see FIG. 3. The transmitter is driven by the signal PULSE_TX from clock generator 202 which is a sequential high/low pattern. Comparator 248 compares the voltage at node TXD and TXB. The voltage difference $\Delta V_{HL}$ between the high and low voltages at these nodes as defined by the impedance of the transmitter cable $Z_O$ and the output impedance of the transmitter $Z_T$ as $$\Delta V_{HL} = \Delta V_{THL} \times Z_O / (Z_O + Z_T)$$

where $\Delta V_{THL}$ is the voltage difference between the high and low at the nodes T+ or T−. For a SATA transmitter $\Delta V_{HL}$ must be 250 mV. Therefore, $\Delta V_{THL}$ needs to be 500 mV if the output impedance is matched to the impedance of the transmission cable, that is $Z_O = Z_T$. It should be noted that $\Delta V_{HL}$ is always 250 mV when the impedance is matched and is independent of the impedance values. It should also be noted that DC level of the nodes TXD and TXDB are not certain because these depend on the input impedance of the host receiver 278, which is unknown. Accordingly, $\Delta V_{HL}$ is AC-coupled to the comparator by capacitors 214 and 234 and a DC voltage $V_{CM}$ generated by the resistors 228, 230 and 232 is coupled to the capacitors via transistors 220 and 226. The comparator then compares the AC-coupled voltage to the reference voltage $V_{REF}$, where $V_{REF} = (V_{CM} + 0.25V)$. After the voltage comparison has been executed, the transistors 220 and 226 are turned ON to reset the voltage at the nodes TXDC ad TXDCB to $V_{CM}$. The transistors are maintained OFF during the comparison.

Comparators typically have a finite input offset voltage and therefore it will misjudge the input comparison on the absolute difference in voltage between the inputs to the comparator is smaller than its input offset voltage. This misjudgment causes a finite error in the impedance calibration. In order to reduce this error, the calibration logic circuit 258 is reset to zero and the multiplexers 240, 242 and 254 are utilized to detect when the comparator is making misjudgements. The three multiplexers are controlled by the clock pulse signal SELECT_A so that all of the "A" or "B" inputs are selected. As the signal SELECT_A proceeds, the voltage TXDC and TXDCB are applied to the inputs of multiplexers 240 and 242, respectively. Alternately, the inputs are switched to the voltage $V_{REF}$. Thus, when the "A" inputs are selected, the signal TXDC on line 238 is applied the inverting input of comparator 248 as the signal IN+, whereas $V_{REF}$ is applied to the noninverting terminal of the comparator as the signal IN−. On the next cycle, the voltage $V_{REF}$ is applied via line 236 to the inverting input of comparator 248 whereas the signal TXDCB is applied via line 216 to the noninverting input of the comparator. At the same time, each of the noninverted and inverted outputs of the comparator are ultimately selected and output by multiplexer 254. When the voltage on TXDC or TXDCB is lower than the voltage $V_{REF}$ and its absolute difference is larger than the input offset voltage of the comparator 248, the output value of multiplexer 254 is always a logical one regardless of which side of the input terminals of the three multiplexers is selected. When the voltage on TXDC or TXDCB is higher than the voltage $V_{REF}$ and its absolute difference is larger than the input offset voltage of the comparator, the output value of multiplexer 254 is always a logical zero. However, when the absolute voltage difference between the signal TXDC or TXDCB and the voltage $V_{REF}$ is smaller than the input offset voltage, the comparator makes misjudgments in the comparison of its input voltages and the output signal on line 256 is a series of alternate logical zeros and logical ones as clock pulse SELECT_A proceeds. After the calibration logic 258 has been reset and the calibration is started, the calibration logic circuit 258 receives a series of logical values, 1, 1, 1, . . . , 1, 0, 1, 0, . . . , 1, 0, 0, 0, . . . , 0. By monitoring the logical values with a logic circuit, one can measure the range of the alternate logical zeros and ones or, the duration of the misjudgment by the comparator, where its two input voltages are within its input offset voltage. This enables one to determine the central point in the range of alternate logical ones and zeros that is likely to provide the minimum error in the impedance calibration, see FIG. 4.

Figure 4:
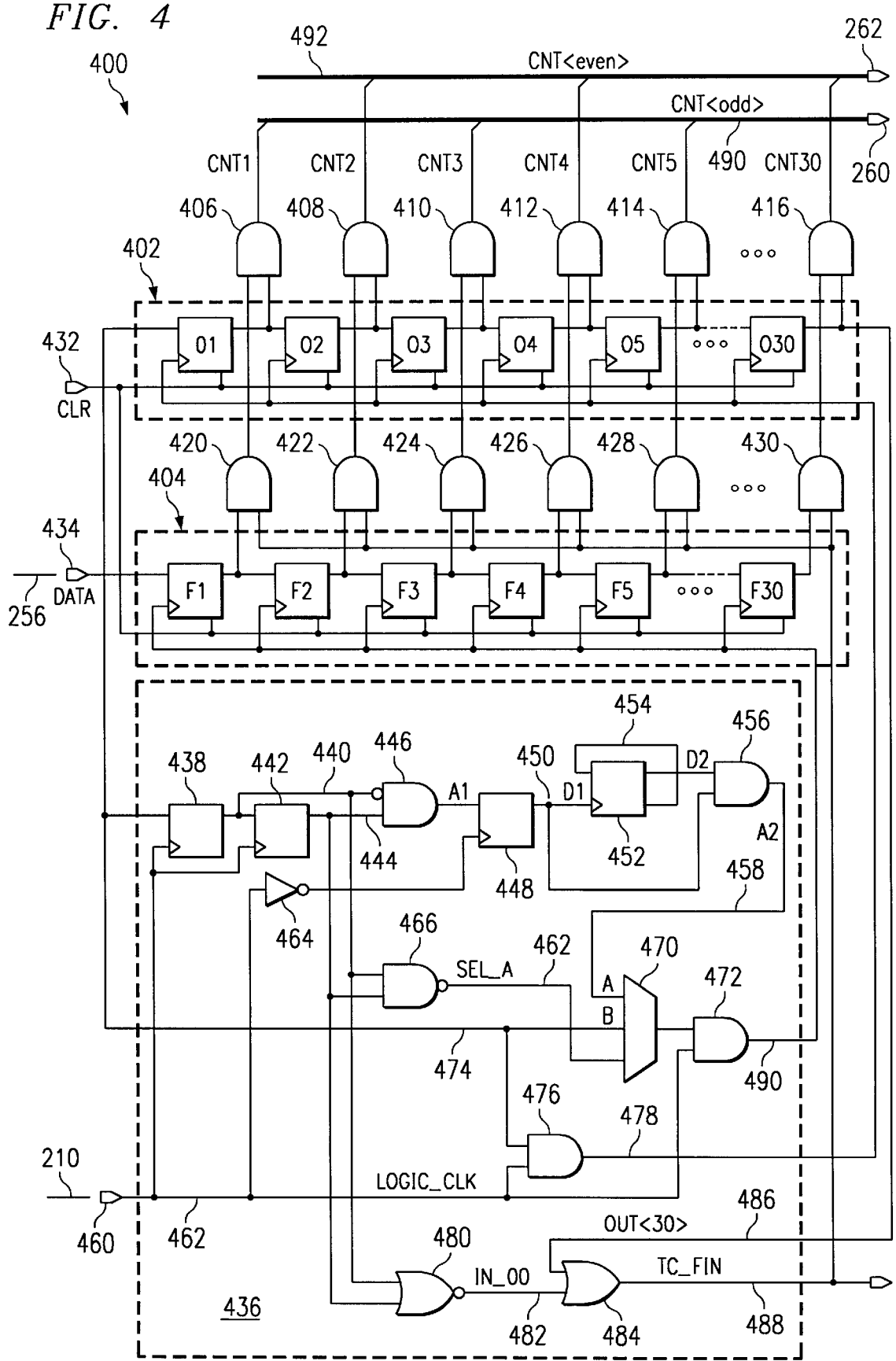
FIG. 4 is a schematic diagram of the calibration logic 258 of FIG. 2.

Referring now to FIG. 4, a circuit for implementing the calibration logic 258 is generally shown as 400. The circuit comprises two shift registers 402, 404 each of which contain 30 flip-flops O1 through O30 and F1 to F30 respectively. The outputs of the flip-flops of shift register 404 are coupled to one input of each of a series of two input AND gates 420, 422, 424, 426, 428, 430; the other inputs of which are coupled to signal TC_FIN output from OR gate 484 on line 488. The outputs of the flip-flops of shift register 402 are coupled to one input of two input AND gates 406, 408, 410, 412, 414, 416. It should be noted that all of the stages O1 . . . ON of shift register 402 and F1 . . . FN of shift register 404 have AND gates such as 406 and 420, respectively connected thereto. The AND gates for the nonillustrated stages do not have reference numbers for clarity. The other input of these AND gates is coupled to the outputs of the AND gates 420, 422, 424, 426, 428, and 430, respectively. The outputs of the AND gates of the odd stages of shift register 402, that is AND gates 406, 410 and 414 are coupled to bus 490 which is connected to the line 260 of FIG. 2. The outputs of the even stages, that is AND gates 408, 412 and 416 are coupled to bus 492 which is connected to the line 262 of FIG. 2. Each of the 30 outputs are connected to one of the 15 resistor paths in one of the two resistor arrays of FIG. 2, for selecting the resistors of the arrays. Both shift registers receive data at terminal 434 which is connected to line 256 of FIG. 2. All of the stages of shift registers 402 and 404 are connected to receive the signal CLR at terminal 432. This signal is shown in FIG. 5. The clock signal for shift register 404 is the output of AND gate 472 and the clock signal shift register 402 is the output of AND gate 476. The signal LOGIC_CLK is applied to terminal 460 via line 210 of FIG. 2. This signal is applied via line 462 to the clock inputs of flip-flops 438 and 442 and via inverter 464 to the clock input of flip-flop 448. The data input of flip-flop 438 is connected to the data terminal 434 and the output of flip-flop 438 is connected to the data input of flip-flop 442. The output of flip-flop 442 is connected to one input of two input AND gate 446, the other input being coupled to the output of flip-flop 438. The output of flip-flop 446 is connected to the data input of flip-flop 448. The output of flip-flop 448 is connected via line 450 to the clock input of flip-flop 452. An output of flip-flop 452 is connected to one input of two input AND gate 456, the other input of which is connected to the output of flip-flop 448. The inverting output of flip-flop 452 is connected to the input of that flip-flop. The output of gate 456 is coupled via line 458 to the "A" input of multiplexer 470. The output of flip-flop 442 and the output of flip-flop 438 are also coupled to the inputs of two input AND gate 466, the output of which is the signal SEL_A on line 468, which is connected to the switching input of multiplexer 470. The signals applied to the inputs of AND gate 466 are also applied to the inputs of NOR gate 480. The output of NOR gate 480 is applied via line 482 to one of the inputs of two input OR gate 484. The other input of OR gate 484 is the serial output of flip-flop O30 of shift register 402. The "B" input to multiplexer 470 is coupled to the data input terminal 434 and the output of multiplexer 470 is coupled to one input of two AND gate 472. The other input of AND gate 472 is connected to receive the signal LOGIC_CLK via line 462. Two input AND gate 476 has one input coupled to the data terminal 434 via line 474 and the second input coupled to the signal LOGIC_CLK via line 462.

Figure 6:
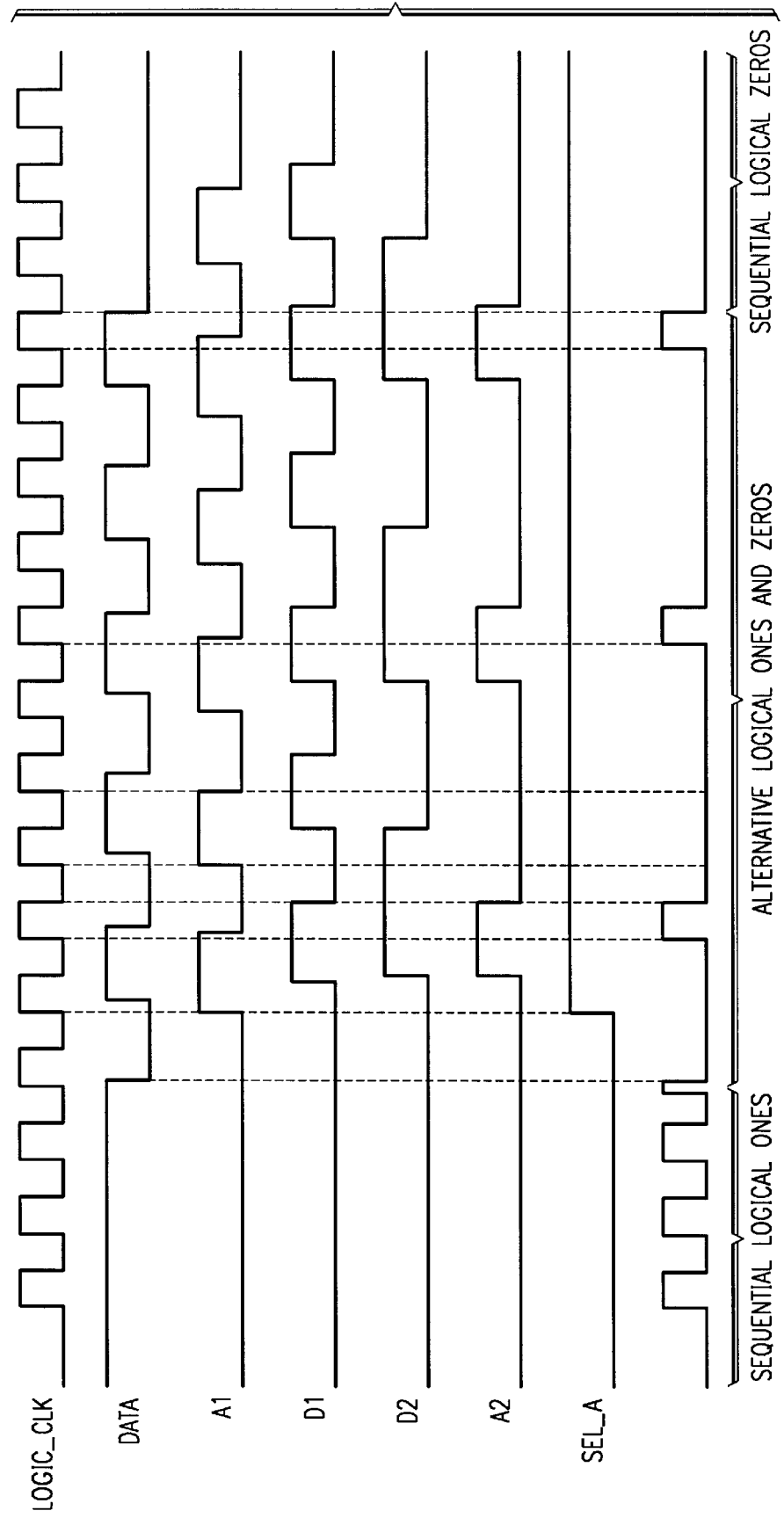
FIG. 6 shows the signals for the block 436 in FIG. 4.

The circuit 436 determines that the output of comparator 248 contains alternate logical ones and zeros. The signal waveforms for the circuit 436 are shown in FIG. 6. AND gate 446 generates a logical one only when the outputs of flip-flops 438 and 442 are zero and one, respectively. If the output of comparator contains alternate zeros and ones, the signal generated by AND gate 446 is half the frequency of the clock signal LOGIC_CLK (see signal A1, FIG. 6). Flip-flop 452 divides the output of AND gate 446 by two to generate a signal containing only half as many logical ones (signal D2, FIG. 6).

The signal SEL_A becomes zero when the data input (the output of comparator 248) is a sequence of logical ones, thus selecting the "B" input of multiplexer 470. The AND gates 476 and 472 act as a clock filter so that the shift registers 402, 404 only see logical ones. The signals sent to the shift registers 402, 404 from the AND gates 472, 476 are identical as signals received by the comparator 248 are outside the offset.

When the signals received by the comparator 248 are within the offset, the comparator 248 generates alternate ones and zeros and the signal SEL_A becomes a logical one. The logical one is applied to the switching input of multiplexer 470 and causes it to select input "A" which is the output of AND gate 456 on line 458. This signal, shown as A2 in FIG. 6, halves the duration of logical ones at the output of flip-flop 452, shown as signal D2 in FIG. 6. Therefore, when alternate logical ones and zeros are output from comparator 248, AND gate 472 generates a logical one every 4 clock cycles and shift register 404 receives half of the logical ones received by shift register 402.

The flip-flop 448 is utilized to provide a delay of half of the LOGIC_CLK cycle in order to avoid timing error problems with the flip-flops.

Both shift registers 402 and 404 receive logical ones only and logical zeros are ignored. The outputs from the flip-flops O1, . . . , O30 in the upper shift register control the state of the transistors in the resistor array until the comparator outputs two zeros and the signal TC_FIN reaches a logical one. The shift register 404 also receives all of the logical ones when the voltage difference at the comparator's input is greater than the offset of the comparator and the comparator outputs a series of logical ones. However, when the signal is within the offset of the comparator, shift register 404 receives only half of the logical ones. When the calibration is finished, the signal TC_FIN is set to a logical one and the data in the output of shift register 402 are replaced with the offset-canceled data in shift register 404 which will now have the correct value for minimum error.

For example, assume that the comparator has an offset voltage of "a" mV and the target impedance is the same as the impedance of the transmission line $Z_0$. The transmitter outputs the signal of 500 mV pulses and the pulses on the transmission line should be 250 mV. The comparator would have a threshold voltage of 250+a mV and 250−a mV. The comparator compares to signals TXD and TXDB alternatively. Thus, the comparator would start to output alternate logical zeros and ones at a voltage of 250−a mV and stop at a voltage of 250+a mV. These voltages correspond to the impedance value of $Z_0$ (250+a)/(250−a) and $Z_0$ (250−a)/

(250+a) ohms. The shift register 402 receives all of the logical ones whether the signal is within or outside the threshold. The shift register 404 receives every logical one when the signal is outside of the offset range. It receives half of the logical ones when the signal is within the offset range. Therefore, at the point the shift register 402 stops receiving any logical ones, the output impedance would be $Z_0$ (250−a)/(250+a), and would be smaller than the target $Z_0$. Therefore we need to step back to a certain point. The amount we need to step back depends on the magnitude of the offset voltage. However, because we have utilized a logarithmic impedance variation, the target impedance is halfway back in the offset range. Therefore, we need to step back half the number of steps the comparator has output alternate ones and zeros. Shift register 404 will automatically have the correct answer. The NOR gate 480 and OR gate 484 are used to detect sequential zeros, which means the calibration has been completed or to detect a logical one at the end of shift register 404, which means the calibration circuit does not have enough capability for this case. For either of these two conditions is detected, calibration stops.

While the invention has been particularly shown and described with reference to the third embodiment thereof, it is well understood by those skilled in the art that various changes and modifications can be made to the invention without departing from the spirit and scope of the invention as defined by the appended claims.

What is claimed is:

1. A transmitter for a serial ATA (SATA) interface comprising:
    a transmitter circuit having a differential output; and
    an impedance matching circuit comprising:
        a pair of resistors, one of the resistors being in series with each of the differential outputs of the transmitter circuit;
        a pair of resistor arrays, one of the arrays being in parallel with each of the series resistors, each of the arrays having a plurality of selectable resistors;
        a calibration circuit coupled to the selectable resistors for selecting resistors in each of the arrays which will be coupled in parallel to the respective series resistor.

2. The transmitter of claim 1 wherein the calibration circuit comprises
    first register means having a serial input to a plurality of stages, each of the stages having a separate output coupled to a resistor in the first or the second array.

3. The transmitter of claim 2 wherein the first register means is a first shift register.

4. The transmitter of claim 3 wherein the calibration circuit further comprises a comparator having a differential input and output;
    first and second multiplexers each having an output coupled to one of the differential inputs to the comparator and each having a first input AC coupled to an output of the impedance matching circuit and a second input coupled to a reference source; and
    a third multiplexer having an input coupled to each leg of the differential output of the comparator and having an output coupled to the serial input of the first shift register.

5. The transmitter of claim 4 further comprising:
    an offset correction circuit wherein the first shift register receives all logical ones from the output of the third multiplexer when the transmitter output is outside the offset of the comparator and half of the logical ones from the output of the third multiplexer when the transmitter output is within the offset of the comparator;
    and further comprising a second shift register coupled to the output of the third multiplexer which receives all of the logical ones from the third multiplexer when the transmitter output is both within or outside of the offset of the comparator; and
    a logic circuit coupled to the output of the third multiplexer and to outputs of the first and second shift registers for determining when calibration is complete.

6. A serial ATA (SATA) system comprising:
    a transmitter circuit having a differential output, each leg of the differential output having a series resistor;
    first and second resistor arrays coupled in parallel to a respective one of the series resistors;
    a transmission line coupled to an output node of each of the resistor arrays, the transmission lines each having a characteristic impedance;
    a host receiver coupled across each of the transmission lines and having an input impedance;
    a calibration circuit coupled to the selectable resistors for selecting resistors in each of the resistor arrays which will be coupled in parallel to the respective series resistor whereby the output impedance is calibrated to the AC impedance of the transmission lines and the DC input impedance of the host receiver.

7. The SATA system of claim 6 wherein the calibration circuit comprises
    first register means having a serial input to a plurality of stages, each of the stages having a separate output coupled to a resistor in the first or the second array.

8. The SATA system of claim 7 wherein the first register means is a first shift register.

9. The SATA system of claim 8 wherein the calibration circuit further comprises a comparator having a differential input and output;
    first and second multiplexers each having an output coupled to one of the differential inputs to the comparator and each having a first input AC coupled to an output of the impedance matching circuit and a second input coupled to a reference source; and
    a third multiplexer having an input coupled to each leg of the differential output of the comparator and having an output coupled to the serial input of the first shift register.

10. The SATA system of claim 9 further comprising:
    an offset correction circuit wherein the first shift register receives all logical ones from the output of the third multiplexer when the transmitter output is outside the offset of the comparator and half of the logical ones from the output of the third multiplexer when the transmitter output is within the offset of the comparator;
    and further comprising a second shift register coupled to the output of the third multiplexer which receives all of the logical ones from the third multiplexer when the transmitter output is both within or outside of the offset of the comparator; and
    a logic circuit coupled to the output of the third multiplexer and to outputs of the first and to outputs of the first and second shift registers for determining when calibration is complete.

11. A method of calibrating output impedance of a serial ATA (SATA) transmitter comprising:
    providing a resistor in each leg of a differential output of a transmitter, each resistor being coupled to a transmission line having a characteristic impedance;

providing a resistor array in parallel with each of the resistors, each array having a plurality of selectable resistors;

selecting one or more resistors from each of the arrays to calibrate the output impedance of the transmitter to match the characteristic impedance of each transmission line with minimum error.

12. The method of claim 11 wherein the selection step comprises comparing an AC signal at each node between the resistor in each leg of the transmitter and the transmission line with a reference to generate logical signals; and utilizing the logical signals to select one or more resistors from each array.

13. The method of claim 12 wherein the utilization step comprises providing the logical one signals to an input of a first register means when the transmitter signal is outside an offset of a comparator and providing one half of the logical one signals to the input of the first shift register when the transmitter signal is within the offset of the comparator; and terminating the calibration method when the resistors in the array have been chosen for minimal error in the output impedance of the transmitter.

14. The method of claim 13 wherein the logical one signals are provided to the input of a first shift register.

15. The method of claim 14 further comprising a second shift register which receives all of the logical one signals output from the comparator both when the transmitter signal is outside the offset and inside the offset of the comparator and wherein the resistors of the arrays are selected utilizing outputs from the first shift register.

16. An offset correction circuit for a comparator comprising:

a first multiplexer coupling a first input to a comparator between a first signal source and a first reference source;

a second multiplexer coupling a second input to the comparator between a second signal source and a second reference source;

a logic circuit coupled to an output of the comparator for detecting when a logical output thereof changes from all logical ones to a combination of logical ones and logical zeros and for determining a central point in the combination of logical ones and logical zeros as a point of minimum error.

17. The offset correction circuit of claim 16 wherein the logic circuit comprises a first register means coupled to receive the logical ones generated by the comparator when the level of the first and second signals is outside of the offset and to receive half of the logical ones generated by the comparator when the level of the first and second signals is within the offset.

18. The offset correction circuit of claim 17 wherein the first register means is a first shift register.

19. The offset correction circuit of claim 18 wherein the logic circuit further comprises a second shift register coupled to receive all of the logical ones generated by the comparator when the first and second signals are both within and outside of the offset.

20. The offset correction circuit of claim 19 further comprising a logical zero detecting circuit for detecting when the second shift register stops receiving logical ones and for stopping the offset correction at that point.

21. The offset correction circuit of claim 20 wherein the comparator is utilized in a selection circuit for selecting resistors in an array having a logarithmic ratio, and wherein at the point of stopping the offset correction, the minimum error in the selection of the resistors is stored in the first shift register.

22. A method of correcting for offset in a comparator comprising:

coupling a first input to the comparator between a first signal source and a first reference source;

coupling a second input to the comparator between a second signal source and a second reference source;

detecting when a logical output of the comparator changes from all logical ones to a combination of logical ones and logical zeros; and determining a central point in the combination of logical ones and logical zeros as a point of minimum error.

23. The offset correction method of claim 22 wherein logical ones generated by the comparator are coupled to an input of a first register means when the first and second signal levels are outside the offset of the comparator and wherein one half of the logical ones generated by the comparator are input to the first register means when the first and second signal levels are within the offset of the comparator.

24. The offset correction method of claim 23 wherein the logical ones generated by the comparator are coupled to an input of a first shift register.

25. The offset correction method of claim 24 wherein logical ones generated by the comparator are coupled to the input of a second shift register when the first and second signals are both within and outside the offset.

26. The offset correction method of claim 25 further comprising determining when the second shift register stops receiving logical ones; and stopping the offset correction at that point.

27. The offset correction method of claim 24 wherein the comparator is part of a circuit that selects resistors in an array having a logarithmic ratio and comprising obtaining the correction from the first shift register at the point where the offset correction is stopped.

* * * * *